United States Patent [19]

Adams et al.

[11] 4,020,461
[45] Apr. 26, 1977

[54] METHOD OF AND APPARATUS FOR TRANSMITTING AND RECEIVING CODED DIGITAL SIGNALS

[75] Inventors: William B. Adams, Camillus, N.Y.; Douglas R. Anderson, Van Nuys; Daniel D. Carpenter, Manhattan Beach, both of Calif.

[73] Assignee: TRW Inc., Redondo Beach, Calif.

[22] Filed: Nov. 18, 1975

[21] Appl. No.: 633,148

[52] U.S. Cl. .................. 340/146.1 AL; 325/41
[51] Int. Cl.² ........................................ G06F 11/12
[58] Field of Search ....... 340/146.1 AL, 146.1 AV, 340/146.1 AX; 179/15 A; 325/41, 42, 38 B

[56] References Cited
UNITED STATES PATENTS

| | | | |
|---|---|---|---|
| 3,983,536 | 9/1976 | Telfer | 340/146.1 AL |
| 3,988,677 | 10/1976 | Fletcher et al. | 325/41 |

Primary Examiner—Charles E. Atkinson
Attorney, Agent, or Firm—John J. Connors; Edwin A. Oser; Jerry A. Dinardo

[57] ABSTRACT

A system for transmitting digital information such as audio or video over a lossy or dispersive medium. The digital information is of the type where certain bits are more important than others and hence the less important bits can suffer a greater bit error rate. Accordingly, the most important bits are encoded into a (7,k) 8-ary Reed Solomon code where 7 is the length of the code and k is the dimension of the code. The less important bits are then respectively encoded into a (7,k+1) or a (7,k+2) 8-ary Reed Solomon code. The code words are modulated onto a plurality of tones or subcarriers. The decoding is effected by initially demodulating the subcarriers and generating a candidate set of code words from each 7-tuple of demodulated 8-ary symbols corresponding to a transmitted code word. The decoding of each transmitted code word is completed by making the statistical decision that the transmitted code word is the member of the associated group of candidate code words maximizing an adaptive maximum likelihood test statistic.

15 Claims, 4 Drawing Figures

METHOD OF AND APPARATUS FOR TRANSMITTING AND RECEIVING CODED DIGITAL SIGNALS

BACKGROUND OF THE INVENTION

This invention relates generally to transmission systems for a dispersive medium and particularly relates to a system for encoding the digital information with different degrees of redundancy and demodulating the received information with the maximum likelihood of detection.

In recent years it has become of increasing importance to be able to transmit digital information over a dispersive channel while still recovering the original information. The digital information may, for example, represent audio information. such as voice, or video information.

To this end it has been proposed in the past to transmit by channel vocoder or linear predictive coding processors. Recently, adaptive predictive coding processors have become known. Such adaptive predictive coding has been disclosed in a paper by Atal et al. which appears in the Bell System Technical Journal, October, 1970, pages 1973 to 1986. In this connection reference is made to another paper by Bayless et al. entitled "Voice Signals: Bit-By-Bit" which appears in IEEE Spectrum, October 1973, pages 28 – 34.

As a result of the adaptive predictive coding, for example of speech, the resulting bits may be classed into groups of bits which are more or less important for the transmission of the informtion. For the most important bits the tolerable bit error rate may be as low as 0.001 and for the next most important bits the bit error rate may be 0.01. Finally, for the residue bits of the coding of the signals a bit error rate as high as 0.10 may be tolerated. Instead of the adaptive predictive coding disclosed in the two papers above referred to, it is also feasible to provide feedback reesidue compression for digital speech. Such a system has been disclosed in the copending application to Sandra E. Hutchins, Ser. No. 612,992 filed on Sept. 12, 1975.

It is therefore desirable, and proposals have been made in the past for encoding the digital information by means of cyclic group codes having more or less redundancy as required by the type of information.

It is well known that the information provided in the form of cyclic group codes can be decoded by means of various error correcting schemes. One such error correcting decoder for cyclic group codes has been disclosed in the patent to Solomon U.S. Pat. No. 3,818,442 which issued on June 18, 1974.

However, when the encoded digital information is transmitted through a dispersive medium, for example by high frequency carriers (from 3 – 30 megahertz), this type of hard decision decoding will result in many errors. The typical dispersive channel may delay some of the information as a function of frequency and it may provide a time variable and frequency variable gain or rather loss. This may be due to the multipath of the information and frequency selective fading. Hence, the received information is of a time varying type in accordance with frequency and other factors to which additionally may be added the white noise of the channel.

In order to deal with this problem it has been proposed to decode the informtion say for a present frame $n$ by looking back on the previous frame ($n$-1). Such a system has been proposed by Chase in a paper which appears in IEEE Transactions on Communications, Vol. COM-21, No. 3, March 1973, pages 159 – 174. As outlined in this paper an initial decision, called a hard decision, on the received vector is made, the decision consisting of determining each code symbol separately. The data concerning the physical signal and the interrelations among the symbols in each code word are now utilized to correct the first decision. The later decision which is sometimes called a soft decoding makes use of an interative scheme whereby the number of iterations is undeterminate. As a result, it may either take too long a time to obtain a final decision or the number of iterations may have to be limited and the initial decision accepted so that the error correction capability is reduced.

It is accordingly an object of the present invention to provide a communication system for digital information utilizing error correcting coding which is modulated onto a plurality of tones or subcarriers.

A further object of the present invention is to utilize for a system of the character discussed an 8-ary Reed Solomon code of the type $(7,k)$ where the 7 represents the length and the $k$ the dimension of the code, so that by varying $k$ the redundancy of the code may be varied for bits of greater or lesser importance.

Another object of the present invention is to decode the transmitted information by first decoding the received information to generate a plurality of candidate code words and thereupon by correlation techniques to obtain maximum likelihood of detection with a fixed number of steps or iterations.

Still a further object of the present invention is to provide a system for transmitting and receiving digital information where the original information is compressed so that it can be transmitted over a frequency restricted channel while still maintaining the fidelity of the original information.

SUMMARY OF THE INVENTION

In accordance with the present invention there is provided a method of and apparatus of encoding and transmitting digital signals representing information. This may, for example, consist of audio such as voice or video information. For the sake of simplicity, the invention will be described hereinafter in accordance with a specific example based on voice information which may be processed, for example, by an adaptive predictive coding voice compressor.

It will also be understood that the digital signals are all represented by electrical signals.

It will further be assumed that the digital signals consist of at least a group of the most important bits, a group of the next most important bits and a group of the least important bits. The first group of bits, that is the most important bits, are now encoded into an 8-ary Reed Solomon code $(7,k)$ where $k$ is substantially less than 7. The next group of bits is then encoded into a $(7,k+1)$ Reed Solomon code and the least important group of bits is transformed, three at a time, into octal form without encoding.

A plurality of subcarriers is generated sufficient in number so that all code words and octal information can be transmitted. To this end each of the subcarriers is differentially phase modulated with the respective code words and octal information or 8-ary symbols.

The phase modulation is such that each subcarrier is capable of assuming eight different values carresponding to the 8-ary code.

How the encoded and transmitted information is decoded will be subsequently explained.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings.

DESCRIPTION OF THE PREFERRED EMBODIMENT

Referring now to the drawings, there is illustrated a specific embodiment of the present invention. It will be understood, however, that the invention is not limited to the embodiment illustrated and to be described. For example, the encoding and transmitting method and apparatus of the invention only requires digital signals representing information which need not be the voice illustrated herein. It is, however, necessary that the digital signals consist of groups of bits of greater or lesser import. Similarly, the information need not be transmitted over the atmosphere and all that is necessary is to transmit the information through a dispersive medium. Furthermore, the carrier frequency need not be high frequency (3 − 30 megahertz), but could be in other frequency ranges. Finally, it will be understood that the specific encoding method illustrated can be modified to suit any particular needs.

Figure 1:
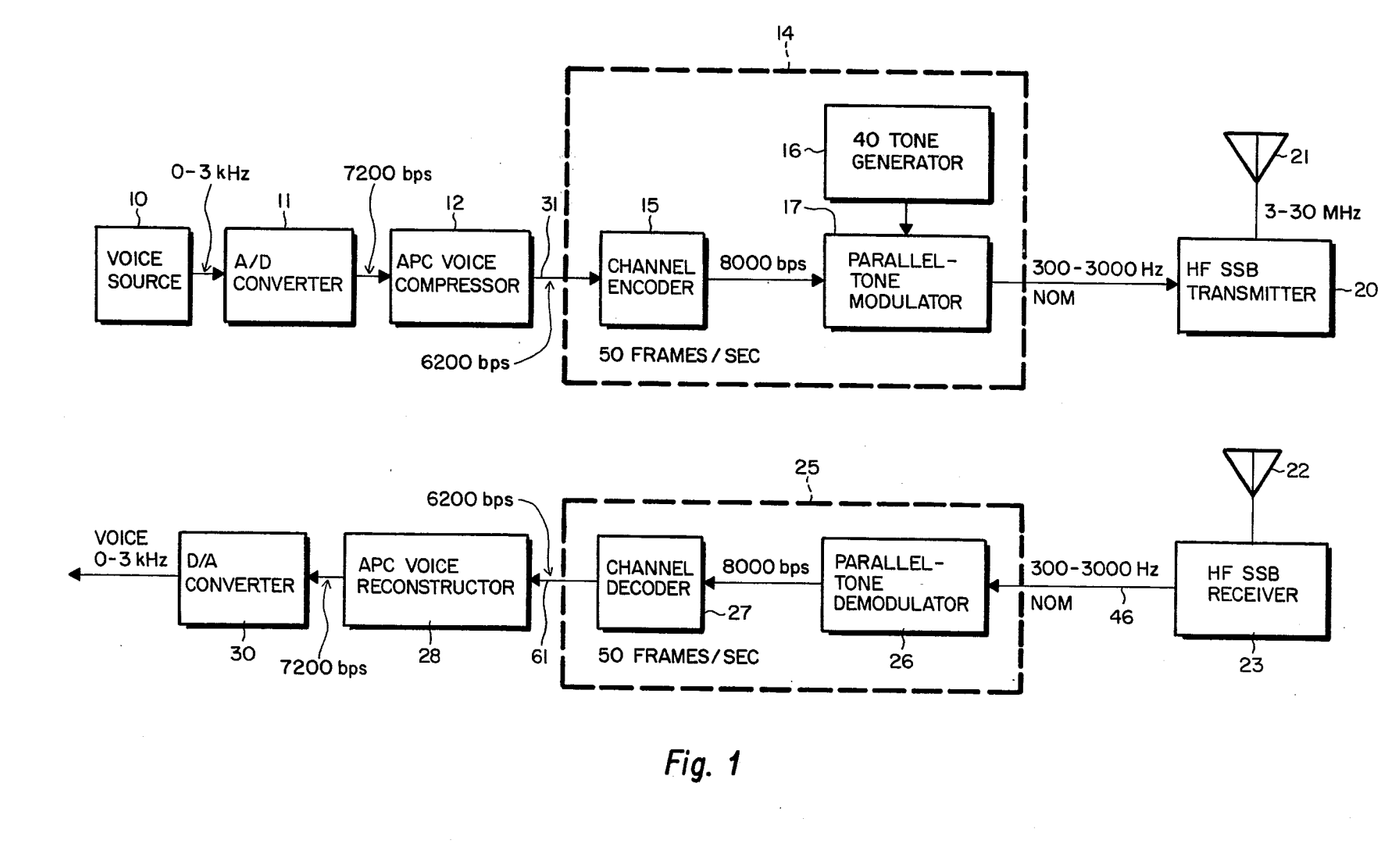
FIG. 1 shows in block form a transmitter and receiver in accordance with the present invention for encoding and decoding the digital information.

Referring now specifically to FIG. 1, there is illustrated by way of example an HF (high frequency) single-sideband transmitter and receiver embodying the present invention. The information to be transmitted is provided by a voice source 10 which may have a frequency range from 0 to 3 khz. This analog signal is now converted by the analog-to-digital converter 11 into digital signals. The result is that the digital signals correspond to 7,200 bits per second (bps). These digital signals are now compressed by a voice compressor 12 which may, for example, be an adaptive pedictive coder of the type discussed in the papers by Atol et al. or Bayless et al. Alternatively, the feedback residue compression of the Hutchins application above referred to, may be utilized. As a result of the digital compression the output of the compressor 12 consist only of 6,200 bps. The 6200 bps can be arranged into various groups of bits of decreasing importance for the fidelity of transmission of voice as is well known in the art.

This information is now encoded by the equipment contained in the dotted box 14. This includes a channel encoder 15 which will be subsequently explained in connection with FIG. 2. The output of the channel encoder consists of 8,000 bps, the larger number being due to the fact that the information is encoded by a redundant cyclic group code. This will be more fully explained hereinafter.

The information is now modulated onto a plurality of tones or subcarriers. The tones are parallel or orthogonal with respect to each other as is well understood. In the present example 40 tones are required which are generated by the generator 16. The 40 tones and the 8,000 bps properly encoded are fed to a parallel tone modulator 17 where the respective tones are modulated by the information represented by the 8,000 bps. In the example illustrated herein, each of the tones is differentially phase modulated by key shifting into one of eight different phases. In addition, the amplitude of each of the tones or subcarriers is modulated in accordance with 40 of the least important group of bits. It should be noted that the information is transmitted at the rate of 50 frames per second. Hence the 8,000 bps correspond to 160 bits per frame. On the other hand, the 6,200 bps fed into the encoder 15 correspond to 124 bits per frame.

The 40 modulated tones are now impressed on the transmitter 20 which, as indicated, may be a single sideband transmitter in the hf frequency range. The subcarrier frequencies vary between 300 and 3,000 hertz nominal. The carrier having a frequency between 3 − 30 megahertz is radiated by the antenna 21 and received by the antenna 22 of the hf single sideband receiver 23.

As indicated before, the transmission takes place over a dispersive medium which will cause errors in the transmitted information varying with time and with frequency.

At the receiver 23 the carrier wave is demodulated to recover the 40 subcarriers or tones which again have a nominal frequency between 300 − 3,000 hz. The subcarriers are now demodulated and decoded in the apparatus contained in the dotted box 25. How this is effected will be subsequently explained in connection with FIGS. 3 and 4. In any case, however, the box 25 includes a parallel tone demodulator 2b which recovers the 8,000 bps from the subcarriers or tones. This information is then decoded by the channel decoder 27 and the information is again processed at the rate of 50 frames per second.

The output of the channel decoder consists of 6,200 bps. Because the redundancy built into the group code has been removed, the information is reconstructed by an adaptive predictive coder for voice and reconstructor 28. This corresponds basically to the compressor 12 as has been explained, for example, in the Hutchins application previously referred to.

The reconstructor 28 generates again 7200 bps which are converted by the digital-to-analog converter 30 into voice having a frequency range from 0 to 3 khz.

Figure 2:
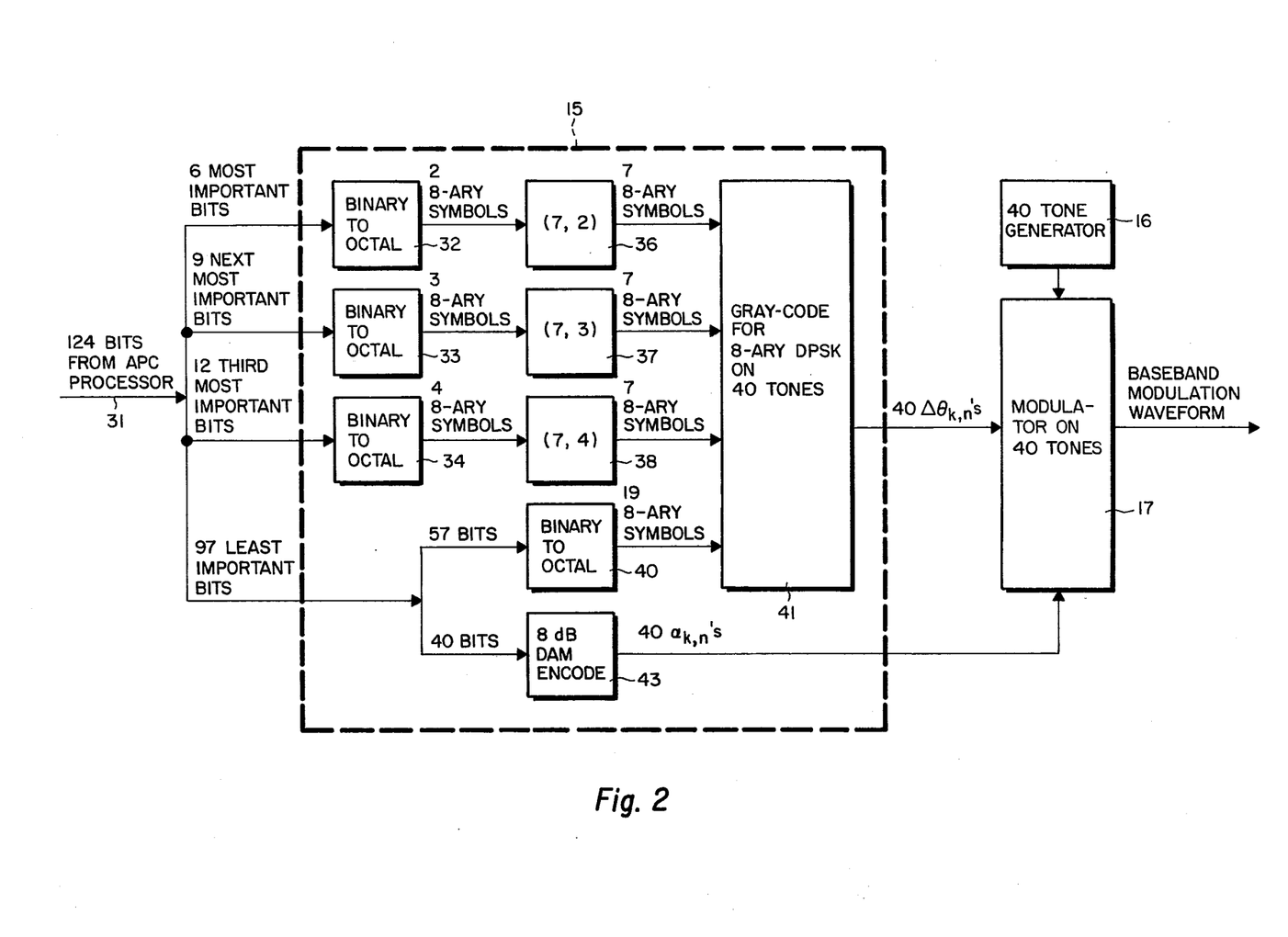
FIG. 2 illustrates in block form the channel encoder and related equipment of the transmitter of FIG. 1.

The channel encoder 15 with the tone generator 16 and modulator 17 are illustrated in more detail in FIG. 2 to which reference is now made. As explained before, the voice compressor 12 generates 6,200 bps which corresponds to 124 bits per frame because there are 50 frames per second. These bits are received on input lead 31 which feeds the dotted box 15 which is the channel encoder. In the example illustrated and described herein the 124 bits per frame may be grouped into six most important bits, nine most important bits and twelve third-most important bits or 27 bits total. This leaves 97 least important bits which together make up the 124 input bits.

These four groups of bits of decreasing importance, the most important three of which are now encoded by means of codes which provide the most redundancy for the most important group of bits etc. In accordance with the present invention the encoding is effected by an 8-ary Reed Solomon code $(7,k)$, where 7 is the length and $k$ the dimension of the code. Concerning Reed Solomon codes reference is made to the Solomon patent above referred to and to the book by Elwyn R. Berlekamp entitled "Algebraic Coding Theory" published by McGraw Hill Book Company, New York, 1968. Such a code is a cyclic code over an algebraic finite field which is sometimes called a Galois field. An 8-ary code has octal numbers or 8 symbols consisting of the numbers from 0 to 7. This corresponds to $2^3$ which is 8 and hence 3 bits make up 1 octal symbol. It will also be understood that $k$ indicates the number of information symbols transmitted, the remainder $(7 - k)$ being check symbols or redundant symbols.

Hence for the six most important bits, there is provided a binary-to-octal converter 32 which converts the 6 bits into two 8-ary symbols. Similarly the nine next most important bits are converted by binary-to-octal converter 33 into three 8-ary symbols. Finally, the twelve third-most important bits are converted by the binary-to-octal converter 34 into four 8-ary symbols.

These nine 8-ary symbols are now encoded into the corresponding 8-ary Reed Solomon code $(7,k)$, where $k$ is respectively 2, 3, or 4 correspondng to the 2, 3 and 4 8-ary symbols obtained from converters 32 to 34.

Accordingly, the converter 32 is coupled to an encoder 36 which encodes the two 8-ary symbols into the Reed Solomon code (7, 2). This will now generate seven 8-ary symbols corresponding to the number 7 or length of the code. Similarly, the three 8-ary symbols of the converter 33 are impressed on the encoder 37 which utilizes the (7,3) Reed Solomon code. Finally, the four 8-ary symbols obtained from converter 34 are impressed on the encoder 38 which utilizes the (7,3) Reed Solomon code. As a result, each of the encoders 36 – 38 develops seven 8-ary symbols making up a total of 21 8-ary symbols. These are used to modulate twenty-one of the forty tones generated by the generator 16. How the remaining nineteen tones are modulated will now be explained.

The ninety-seven least important bits are again split up into a group of fifty-seven bits and another group of forty bits. The fifty-seven bits are converted by another binary-to-octal converter 40 into nineteen 8-ary symbols. These symbols are not encoded but are directly used for modulating the remaining nineteen of the forty tones. As remarked above, the remaining 40 bits are modulated on the amplitudes of the 40 tones, one bit per tone.

How the encoders 36, 37 and 38 convert the 8-ary symbols received into coded 8-ary symbols will now be explained.

The $k$ information symbols may be represented as follows: $V_1, V_2, \ldots V_k$ where V stands for a vector. The redundancy symbols or check symbols correspond to $7-k$ and are represented as follows: $V_k{}^+{}_1, \ldots V_7$. The redundancy symbols are obtained from the information symbols by means of the following Table I which gives the recursion relation.

Table I

| k | Recursion Relation |
|---|---|
| 2 | $V_n = 1 \cdot V_{n-1} + 5 \cdot V_{n-2}, n = 3,\ldots,7$ |
| 3 | $V_n = 6 \cdot V_{n-1} + 1 \cdot V_{n-2} + 3 \cdot V_{n-3}, n = 4,\ldots,7$ |
| 4 | $V_n = 5 \cdot V_{n-1} + 5 \cdot V_{n-2} + 6 \cdot V_{n-3} + 2 \cdot V_{n-4}, n = 5,\ldots,7$ |

In the above Table I the operation of ( ) and (+) for 8-ary symbols may be defined as follows:

$$A + B = B + A = (a_1 + b_2, a_2 + b_\cdot, a_3 + b_3) \quad (1)$$

$$A \cdot B = B \cdot A = (a_1b_1 + a_2b_3 + a_3b_2,\ a_1b_2 + a_2b_1 + a_2b_3 + a_3b_2 + a_3b_3,\ a_1b_3 + a_3b_1 + a_2b_2 + a_3b_3) \quad (2)$$

In the above formulas (1) and (2), both additions and multiplications are mod 2. The following Table II gives the results of equation (1), that is for the addition of $A+B$ or $B+A$.

Table II

| A = | 0 | 1 | 2 | 3 | 4 | 5 | 6 | 7 |
|---|---|---|---|---|---|---|---|---|
| β = 0 | 0 | 1 | 2 | 3 | 4 | 5 | 6 | 7 |
| 1 |   | 0 | 3 | 2 | 5 | 4 | 7 | 6 |
| 2 |   |   | 0 | 1 | 6 | 7 | 4 | 5 |
| 3 |   |   |   | 0 | 7 | 6 | 5 | 4 |
| 4 |   |   |   |   | 0 | 1 | 2 | 3 |
| 5 |   |   Symmetric   |   |   | 0 | 3 | 2 |
| 6 |   |   |   |   |   |   | 0 | 1 |
| 7 |   |   |   |   |   |   |   | 0 |

As indicated in the Table II, the results are symmetric and hence only half of them are shown.

Similarly, the following Table III shows the results of multiplication, that is A B or B A.

Table III

| A = | 0 | 1 | 2 | 3 | 4 | 5 | 6 | 7 |
|---|---|---|---|---|---|---|---|---|
| β = 0 | 0 | 0 | 0 | 0 | 0 | 0 | 0 | 0 |
| 1 |   | 3 | 6 | 5 | 1 | 2 | 7 | 4 |
| 2 |   |   | 1 | 7 | 2 | 4 | 3 | 5 |
| 3 |   |   |   | 2 | 3 | 6 | 4 | 1 |
| 4 |   |   |   |   | 4 | 5 | 6 | 7 |
| 5 |   |   Symmetric   |   |   | 7 | 1 | 3 |
| 6 |   |   |   |   |   |   | 5 | 2 |
| 7 |   |   |   |   |   |   |   | 6 |

Again the multiplication table is symmetric as shown. It will be understood that the Tables II and III are for the code $(7,k)$, for all choices of $k$. Hence by means of the above Tables II and III, the three redundancy symbols of each code (7,4) are reduced to 7 table lookups per symbol or a total of 21 table lookups per word.

Turning again to FIG. 2, the encoders 36 – 38 and the binary-to-octal converter 40 have their outputs connected to the Gray code generator 41. This will convert the forty 8-ary symbols by means of a Gray code into 8-ary differential phase shifts for each of the forty tones. The following Table IV first shows the three binary numbers $c_1, c_2, c_3$ corresponding to the octal symbols. The next column $\Delta\theta$ shows the differential phase sift in degrees and the last row shows the corresponding octal symbols.

Table IV

| $(c_1, c_2, c_3)$ | $\Delta\theta$ in degrees | Octal Symbols |
|---|---|---|
| 001 | 22.5 | 1 |
| 000 | 67.5 | 0 |
| 100 | 112.5 | 4 |
| 101 | 157.5 | 5 |
| 111 | 202.5 | 7 |
| 110 | 247.5 | 6 |
| 010 | 292.5 | 2 |
| 011 | 337.5 | 3 |

This operation has to be effected during a particular or $n$th frame and for each of the forty or $k$ tones.

Accordingly 40 $\Delta\theta_{k,n}$ are developed by the Gray encoder 41 and are impressed on the modulator 17 which now modulates the forty tones from the tone generator 16 by differential phase shift keying. The differential phase shift keying means that the phase is shifted differentially from the corresponding tone of the previous frame, that is the $n$-1 frame. Hence at the receiver the information from the previous frame, that is the $n$-1 frame must be stored to compare it with the information from the present or $n$th frame.

Turning now to the remaining forty bits forming part of the 97 least important bits, it will now be explained how they are impressed on the forty subcarriers. The 40 bits are impressed on an encoder 43 which provides a differential amplitude modulation of 8 db on each of the forty subcarriers. This may be expressed as $a_{k,n}$ where $k$ corresponds to one of the forty tones and $n$ is the frame. For the differential amplitude modulation $a_{k,n}$ is either high, that is A$\beta$ or low, that is A/$\beta$. In this case, $\beta$ = 1.5849 corresponding to the 8 db previously mentioned, while A is a scale factor.

The following table indicates how the amplitude of each carrier can be modulated to obtain either 1 or 0.

Table V

| Bit to be sent as DAM or $k^{th}$ tone on nth frame | $a_{k,n-1}$ | $a_{k,n}$ |
|---|---|---|
| 1 | A$\beta$ | A/$\beta$ |
|   | A/$\beta$ | A$\beta$ |
| 0 | A$\beta$ | A$\beta$ |
|   | A/$\beta$ | A/$\beta$ |

A detection rule is as follows $$\frac{1}{\beta^2} \left| C_{k,n-1} \right|^2 < \left| C_{k,n} \right|^2 < \beta^2 \left| C_{k,n-2} \right|^2,$$

decide that a 0 was transmitted, otherwise decide that it was a 1.

It will now be evident that the forty tones obtained from modulator 17 are differentially phase shifted and amplitude modulated to transmit the information corresponding to the 124 bits per frame. These modulated subcarriers are then impressed on a carrier and transmitted by the transmitter 20 in the manner previously explained.

Some of the advantages of a $(7,k)$ Reed Solomon code with 8-ary symbols for this particular application will now be enumerated. The code is insensitive to whether the symbol errors occurred at random or in contiguous bursts across the various tones or subcarriers. Furthermore, the code is flexible because it readily permits the nonuniform coding protection as used herein. In other words, it makes it possible to provide greater or lesser redundancy for the more or less important groups of bits. Since the code has 8-ary symbols it is matched to the differential phase shift keying of particular separate phase shifts corresponding to three bits. Finally, it makes more efficient use of the redundancy symbols than does any binary code.

Figure 3:
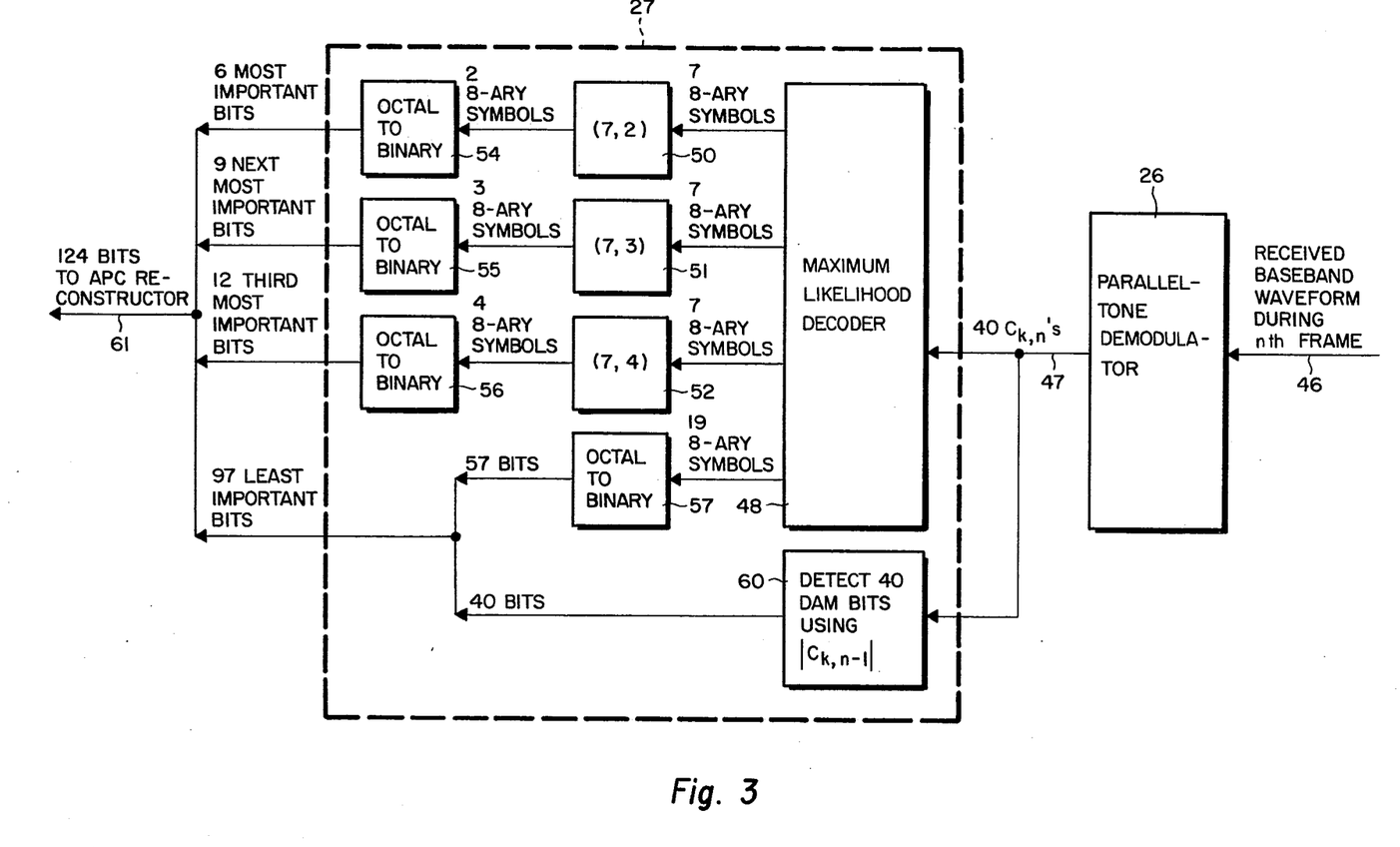
FIG. 3 illustrates in block form the channel decoder and associated equipment which provides the maximum likelihood of detection and forming part of the receiver of FIG. 1.
Figure 4:
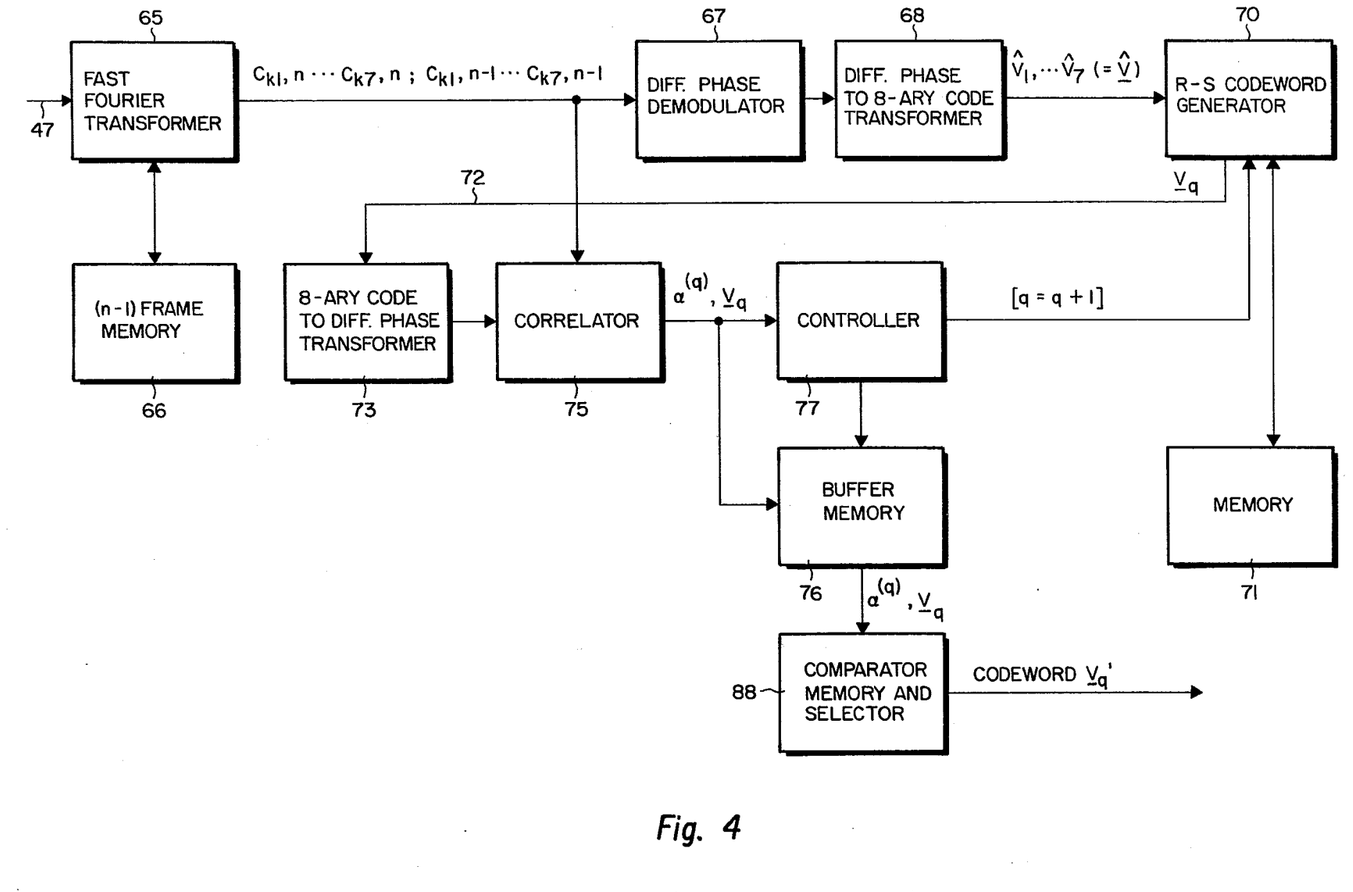
FIG. 4 is a detailed block diagram of the received vector decoder of FIG. 3 and illustrates how a first hard decision is made whereby each received vector is transformed into a plurality of candidate code words which are then decoded or corrected in accordance with the maximum likelihood decision scheme.

Reference is now made to FIGS. 3 and 4 which illustrate in block form and in more detail the apparatus of the invention for demodulating the previously encoded information. In general, the decoding takes place in two stages. For the firs step use is made of the algebraic and cyclic first of the 8-ary $(7,k)$ Reed Solomon code. Instead of generating all possible code words, a subset of practical size is generated or obtained from a memory. Hence, a certain number of candidate code words are generated from each received code word. Subsequently, an approximate maximum likelihood test statistic is generated from the outputs of the parallel tone demodulator 26 of FIG. 3 and from each of the candidate code words in the subset. The code word which gives the miximum value for this test statistic is then selected as the most likely correct code word.

The thus corrected code word is also demodulated in accordance with the Gray code, each code word is decoded to generate the corresponding 8-ary symbols which are then transformed from octal to binary.

At the same time, the differential amplitude modulated information is detected by comparison of the amplitudes of the forty tones for the present frame with those of the previous frame.

Turning now to FIG. 3, there is illustrated the parallel tone demodulator 26 of FIG. 1 and the channel decoder 27 of FIG. 1. Thus, the received baseband waveform during the $n$th frame is received from lead 46, that is from the receiver 23. In a manner subsequently to be explained in connection with FIG. 4, the channel decoder 27 generates forty code words from the frame $n$ and $k$ which stands for one of the octal symbols derived from the subcarrier. This might be termed $C_{k,n}$. In other words, this symbol is the tone correlator output for the $k$th tone or subcarrier at the end of the $n$th frame.

These code words are generated on the decoder 27. The demodulator tones are impressed on the decoder 48 of the received vectors. The demodulator 27 will detect the forty Gray coded tribits by utilizing $C_{k,n}$ and $C^*_{k,n-1}$. Here the $(n-1)$ stands for previous frame. The $C^*$ indicates the conjugate of C.

Hence, the outputs of the decoder 48 are respectively the three sets of seven 8-ary symbols which were initially generated at the transmitter by the respective encoders 36 – 38. These three sets of seven 8-ary symbols are now impressed on the decoders 50, 51 and 52 which decode in accordance with the Reed Solomon (7,2); (7,3); (7,4) codes. As a result the three decoders 50 – 52 respectively generate 2, 3 and 4 8-ary output symbols. These in turn are impressed on three octal-to-binary converters 54, 55 and 56. These in turn regenerate respectively the 6 most important bits, the 9 next most important bits and the 12 thirdmost important bits.

At the same time the decoder 48 generates nineteen 8-ary symbols which have not been encoded at the transmitter. Hence the nineteen 8-ary symbols are converted by the octal-to-binary converter 57 to generate 57 output bits.

It will be recalled that the forty tones or subcarriers were also differentially amplitude modulated. Hence the detector 60 connected to the output of demodulator 47 will demodulate the differentially amplitude modulated bits again by comparison with the information from the previous frame and this can be indicated by $C_{k,n-1}$. This in turn will yield forty bits corresponding to the forty tones which are added to the 57 bits of the octal-to-binary converter 57 to yield 97 least important bits. Hence the demodultor 26 includes a memory to store $C_{k,n-1}$.

It will now be evident that the 124 bits per frame which have initially been transmitted have all been demodulated and are available from output lead 61 and are impressed on the adaptive predictive or voice reconstructor 28 of FIG. 1. This in turn will regenerate the original voice.

How the received information is initially decoded to correct for the errors caused by the dispersive medium will now be described in connection with FIG. 4. Basically, the blocks of FIG. 4 correspond to the decoder 48 of received vector of FIG. 3. The demodulated tones during the $n$th frame as obtained from lead 47 are impressed on the fast Fourier transformer 65. Such Fourier transformers are well known. The transformer 65 is coupled to the memory) 66 which stores the information received on the previous frame, that is the $(n-1)$ frame. In other words, in accordance with the present invention, it is necessary to look at the previous frame, that is the $(n-1)$ frame and the present or $n$ frame of the array of received tones because the phase modulation is a differential modulation and the phase change of each tone must be compared to the previous phase of the same tone. The phase change of 7 tones will make up one received code word or vector. Hence, the output of the transformer 65 is:

$$C_{k1,n} \ldots C_{k7,n}; C_{k1,n-1} \ldots C_{k7,n-1} \qquad (4)$$

As explained before, the terms $C_{kj,n}$ and $C_{kj,n-1}$ are complex tone correlator outputs corresponding to the respective tones on the $n$th and $(n-1)$th frames, while $j$ indicates a number from 1 to 7. The test statistic is calculated as follows:

$$\alpha^{(q)} = Re\left\{ \sum_{j=1}^{7} C_{kj,n} C^*_{kj,(n-1)} e^{-i\Delta\theta^{(q)}_{kj,n}} \right\} \qquad (5)$$

In this formula $\Delta\theta$ is again a differential phase for the respective $k$'s and $n$'s or frames. The product of $C \times C^*$ is the measurement of the channel gain or loss. The exponent of $e$ again depends on the particular code word. The symbol $q$ is a number from 1 to $$\binom{7}{k}$$

as will be subsequently explained. Thus basically by calculating the test statistic of equation (5) a code word is determined or found which has a maximum likelihood of being the correct code word.

The respective $C_{kj,n}$ and $C_{kj,n-1}$ obtained from transformer 65 are now impressed on a differential phase demodulator 67 which determines the differential phase, that is the $\Delta\theta$. This phase difference is now transformed by the transformer or decoder 68 to the corresponding 8-ary code, that is $\hat{V}_1, \ldots \hat{V}_7$ which might be referred to as $\hat{V}$. This will also transform or decode the received 8-ary symbols in accordance with the Gray code. Hence, the output of the transformer 68 are the detected 7-tuples of the 8-ary symbols or vectors. This represents the received information or vectors which is generally erroneous and hence must be corrected.

As previously explained, the first step of the decoding takes place by making use of the cyclic properties of the Reed Solomon code. Hence the output of the transformer 68 is fed into the Reed Solomon (R-S) code word generator 70. In other words, the generator 70 gnerates from the $\hat{V}$ the Vg, that is the $q$th "candidate " code word. This is generated from the input 8-ary symbols or vectors by deleting certain positions by means of a suitable mask. The $q$th combination of the $(7-k)$ symbols, that is the check symbols are deleted, and proper code word symbols are substituted therefor. This is effected by utilizing a suitable deletion mask. The deletion mask has a number of symbols corresponding to those of the check marks, that is $(7-k)$. Thus, if $k$ is 3, four symbols corresponding to check marks can be deleted and subsequently reconstructed. This may be effected by the following matrix:

$$\begin{bmatrix} V^{(n_1)} \\ V^{(n_2)} \\ V^{(n_3)} \end{bmatrix} = [G] \begin{bmatrix} \hat{V}_{n_4} \\ \hat{V}_{n_5} \\ \hat{V}_{n_6} \\ \hat{V}_{n_7} \end{bmatrix} \qquad (6)$$

There are five different matrices [G] and each matrix has three rows and four columns. It will be understood that for the other Reed Solomon codes (7, 2) and (7, 4) different masks will have to be used. However, for a given mask the G matrix remains unchanged, while seven cyclic permutations are performed of the detected 8-ary symbols. This will yield thirty-five candidate code words, that is 5 × 7.

It will be realized that if $k$ is 2, 3 or 4, the respective total number of words in the code is 64, 512 and 4096. Instead of generating such a large number of candidate words, in accordance with the present invention a much smaller subset is used which can be calculated from $$\binom{7}{k}.$$

Hence $q$ represents this subset of code words. Hence if $k$ is 2, the number of candidate words in the subset is 21 corresponding to $$\binom{7}{2}.$$

For $k = 3$ or 4 the number of candidate codes in the subset is 35 because $$\binom{7}{3} = \binom{7}{4} = 35.$$

The G matrix corresponding to equation (6) is given by the following table.

Table VI

| Deletion Mask Indices | G-Matrix | | | |
|---|---|---|---|---|
| 1, 2, 3 | 2 | 6 | 5 | 5 |
|  | 4 | 3 | 1 | 2 |
|  | 1 | 7 | 7 | 5 |
|  | 5 | 5 | 6 | 2 |
| 1, 2, 4 | 7 | 5 | 7 | 1 |
|  | 7 | 6 | 6 | 3 |
|  | 7 | 6 | 3 | 6 |
| 1, 2, 5 | 5 | 6 | 2 | 5 |
|  | 1 | 3 | 4 | 2 |
|  | 2 | 4 | 3 | 1 |
| 1, 2, 6 | 3 | 1 | 2 | 4 |
|  | 1 | 3 | 4 | 2 |
|  | 5 | 7 | 7 | 1 |
| 1, 3, 5 | 2 | 3 | 1 | 4 |
|  | 6 | 6 | 7 | 3 |

Hence it will be realized that the code word generator 70 will either generate or recall from memory 71 connected thereto the corresponding subset of code words, that is 21 or 35 code words as the case may be. The output of the generator 70 which may be termed $\underline{V}_q$ which consists of candidate code words is obtained on lead 72 and is impressed on the transformer 73 which transforms the 8-ary code into a differential phase corresponding to the original phase modulation.

The differential phase transformer 73 impresses its output upon a correlator 75 which correlates the output of the transformer 73 with that of the fast Fourier transformer 65. Such correlators are well know in the art. The output of the transformer 73 is as follows:

$$e^{i\Delta\theta_{k1,n}^{(q)}} \ldots e^{i\Delta\theta_{k7,n}^{(q)}} \quad (7)$$

The output of the correlator 75 is as follows:

$$\alpha^{(q)}, \underline{V}_q \quad (8)$$

This output is temporarily stored in the buffer memory 76 having an output $$\alpha^{(q)}, \underline{V}_q$$

and is also put into a controller 77. The controller 77 keeps track of the sequence of $q$'s, that is the respective candidate code words. Hence, when $q$ has changed by one as indicated by the symbol $[q=q+1]$ this information is impressed on the code word generator 70 to generate the next candidate code word and impress it on the transformer 73. At the same time, the information is passed on to the buffer memory 76 so that its content can be impressed on the comparator memory and selector 80. This will compare the successive values of $\alpha(q)$ for each $\underline{V}_q$ to carry out the test statistic of the maximum likelihood. In other words, for whichever code word the $\alpha(q)$ is a maximum.

This is the code word that is finally selected by the selector 88 and may be designated $\underline{V}_q{}^1$. After $q$ has reached the value $$\binom{7}{4}$$

as determined by the controller 77, the next received vector is demodulated. In this manner the maximum likelihood code word is generated.

Thus in summary, it might be said that the decoding as described in FIGS. 3 and 4 is an algebraic decoding making use of the cyclic properties of the received 8-ary symbols to generate a subset of candidate code words. These are then tested by what might be called adaptive decoding since the $C_{k,n}$'s depend on the time varying properties of the dispersive channel, and the one candidate code word which has the maximum value of the test statistic of equation (5) is selected.

Although the above formulas (5) and (7) have been derived with the assumption that the respective subcarriers have no amplitude modulation, experience has shown that a correction that could be made for the amplitude modulation of the subcarrier does not improve the performance of the decoder. Hence, there is obviously no need for such a correction.

It should also be noted that the adaptive decoding as described in connection with FIG. 4 is applicable to any code which is transmitted by differential phase shifting and does not depend on the particular 8-ary Reed Solomon code discussed herein.

There has thus been disclosed a method of and apparatus for digital signal processing. The digital signals are of the type where certain groups of bits are more important than others. Hence, at the transmitter the more important groups of bits are encoded by a code having a low information content, while the less important bits are encoded by the same code having a larger information content. A particularly suitable code is the octal Reed Solomon code $(7,k)$ where $k$ may, for example assume the value between 2 and 4, and the information is encoded on a plurality of tones or subcarriers by differential phase shift keying so that each subcarrier may have eight distinct phases corresponding to an 8-ary symbol.

At the receiver the information is decoded first by making use of the cyclic properties of the code and then by an adaptive decoding procedure where each of the previously generated candidate words is tested for the maximum of the test statistic. This will yield a code word which has a maximum likelihood of being correct. Particular advantages of the 8-ary Reed Solomon code used in accordance wtih the invention have also been explained.

What is claimed is:

1. The method of encoding and transmitting digital signals representing information, the digital signals including at least three groups of most important, next most important and least important bits, the method comprising the steps of:
   a. encoding the most important bits represented by electrical signals into an 8-ary Reed Solomon code $(7,k)$ where $k$ is the dimension of the code and is substantially less than 7;

b. encoding the next most important bits represented by electrical signals into an 8-ary Reed Solomon code (7,$k$+1);

c. encoding the least important bits represented by electrical signals into octal form;

d. generating a plurality of subcarriers corresponding to the number of code words and octal information to be transmitted;

e. differentially phase modulating each of the subcarriers with the respective code words and octal information so that the differential phases of each subcarrier are capable of assuming 8 different values; and f. transmitting the modulated subcarriers or a carrier;

2. The method defined in claim 1 wherein the digital signals to be transmitted include a fourth group of bits being less important than the next most important bits and more important than the least important bits and including the step of:

encoding the fourth group of bits represented by electrical signals into an 8-ary Reed Solomon code (7,$k$+2).

3. The method defined in claim 1 wherein at least some of the least important bits are encoded by differentially modulating the amplitude of at least some of the subcarriers.

4. The method defined in claim 1 wherein the subcarriers are differentially phase modulated with the respective information in accordance with the Gray code.

5. The method defined in claim 1 wherein the modulated carrier is transmitted through a dispersive medium and including the additional steps of generating from the received carrier sets of candidate words for each received 7-tuple and demodulating the candidate code words in acccordance with the maximum likelihood of detection.

6. Apparatus for encoding and transmitting digital signals representing information, the digital signals including at least three groups of most important, next most important and least important bits, said apparatus comprising:

a. a binary-to-octal converter for each of said groups of bits represented by electrical signals to provide corresponding 8-ary symbols;

b. a plurality of encoders corresponding in number to said binary-to-octal converters, a first one of said encoders for encoding a set of 8-ary symbols into an 8-ary Reed Solomon code (7,$k$), where the 7 represents the length and $k$ the dimension of the code, successive encoders converting the received 8-ary symbols into the corresponding (7,$k$+1) and (7,$k$+2) codes;

c. means for generating a plurality of subcarriers;

d. means for differentially phase modulating each of the subcarriers in accordance with one of the code words obtained from one of said encoders so that the differential phases of each subcarrier are capable of assuming 8 different values; and e. means for transmitting the modulated subcarriers.

7. Apparatus as defined in claim 6 wherein the modulated subcarriers are transmitted through a dispersive medium and including a. means for demodulating each of said subcarriers;

b. means for generating a set of candidate code words for each received 7-tuple; and c. means for demodulating the candidate code words in accordance with the maximum likelihood of decoding.

8. Apparatus as defined in claim 6 wherein said means for modulating the subcarriers includes means for phase modulating the subcarriers in accordance with the Gray code.

9. Apparatus as defined in claim 7 wherein said means for demodulating the received subcarriers includes means for detecting the Gray modulated 7-tuples.

10. Apparatus for decoding transmitted digital signals representing information, the digital signals being encoded in the form of an 8-ary Reed Solomon code (7,$k$), where $k$ is the dimension of the code, the code words being modulated by differential phase shift keying on a plurality of subcarriers, said apparatus comprising:

a. means for receving the modulated subcarriers;

b. means for Fourier transforming the received information, said means including a memory for storing the information received during the previous frame;

c. a differential phase demodulator coupled to said Fourier transformer for demodulating the information phase shifted on the subcarriers;

d. a first transformer coupled to said phase demodulator for transforming the differential phase into the 8-ary Reed Solomon code to derive a plurality of received vectors;

e. a Reed Solomon code word generator coupled to said first transformer and including a memory for generating a subset of Reed Solomon code words corresponding in number to $$\binom{7}{k},$$

the subset consisting of candidate code words;

f. a second transformer for transforming the 8-ary code back into differential phases;

g. a correlator coupled to said second transformer and to said Fourier transformer means for determining the function $\alpha(q)$ which is a test statistic and determining which code word corresponds to the largest value of the test statistic;

h. a controller having its input coupled to said correlator and its output coupled to said code word generator for causing said generator to generate the subsequent candidate code word when the previous code word has been processed; and i. a comparator and selector coupled to said controller for selecting that candidate code word corresponding to the largest value of the test statistic.

11. The method of demodulating digital signals transmitted over a dispersive channel and which have been encoded in accordance with an 8-ary cyclic group code, the code words being modulated by differential phase shift keying on a plurality of subcarriers, the method comprising the steps of:

a. receiving the modulated subcarriers;

b. Fourier transforming the received information;

c. storing the information received during the previous frame;

d. differentially demodulating the information phase shifted on the subcarriers;

e. generating a subset of candidate code words from each received vector, the subset consisting of a predetermined number of vectors;

f. correlating each candiate code word with a received vector and calculating and $^{(q)}$, where represents a maximum likelihood test statistic and $q$ is a number from 1 to $n$; and g. selecting the one candidate code word with the largest value of $^{(q)}$.

12. The method defined in claim 11 wherein the digital information has been encoded in the form of an 8-ary Reed Solomon code $(7,k)$, where $k$ is the dimension of the code, and wherein the number of the subset of candidate words is $$\binom{7}{k}.$$

13. Apparatus for decoding transmitted digital signals representing information, the digital signals representing information, the digital signals being encoded in the form of an 8-ary cyclic group code, the code words being modulated by differential phase sift keying on a plurality of subcarriers, said apparatus comprising:

a. means for receiving the modulated subcarriers;

b. means for Fourier transforming the received information, aid means including a memory for storing the information received during the previous frame;

c. a differential phase demodulator coupled to said Fourier transformer for demodulating the information phase shifted on the subcarriers;

d. means for generating from each received vector a predetermined subset of candidate code words;

e. a correlator coupled to said generator and to said means for receiving, said correlator calculating the function $^{(q)}$ and determining the candidate code word for which the $^{(q)}$ is a maximum;

f. means for storing each of the candidate code words; and g. means for selecting the code word with the greatest value of $^{(q)}$.

14. Apparatus as defined in claim 13 wherein the digital signals are encoded in the form of an 8-ary Reed Solomon code $(7,k)$, where $k$ is the dimension of the code and wherein said means for generating includes a Reed Solomon code word generator having a memory for generating a subset of Reed Solomon code words corresponding to $$\binom{7}{k}.$$

15. The apparatus defined in claim 14 wherein a controller is coupled between said correlator and said generator for causing said generator to generate the subsequent candidate code word when the previous code words have been processed, and a buffer memory coupled to said controller and to said correlator for temporarily storing the last candidate code word and having its output connected to said comparator.

* * * * *

UNITED STATES PATENT AND TRADEMARK OFFICE
CERTIFICATE OF CORRECTION

PATENT NO. : 4,020,461
DATED : April 26, 1977
INVENTOR(S) : William B. Adams, et al.

It is certified that error appears in the above-identified patent and that said Letters Patent are hereby corrected as shown below:

Column 15:

Line 2, after "calculating", delete [and] and add -- $d$ --. After "where", add -- $d$ --.

Line 6, after "of", add -- $d$ --.

Line 22, after "phase", delete [sift], and add --shift--.

Line 26, after "information," delete [aid] and add --said--.

Column 16:

Line 10, after "of", add -- $d$ --.

Line 17, after "corresponding", add --in number--.

Signed and Sealed this

Seventh Day of March 1978

[SEAL]

Attest:

RUTH C. MASON
Attesting Officer

LUTRELLE F. PARKER
Acting Commissioner of Patents and Trademarks